US010990151B2

(12) United States Patent
Grimsrud et al.

(10) Patent No.: US 10,990,151 B2
(45) Date of Patent: Apr. 27, 2021

(54) REDUCTION OF SSD BURST CURRENT USING POWER LOSS ENERGY STORE

(71) Applicant: Intel Corporation, Santa Clara, CA (US)

(72) Inventors: Knut Grimsrud, Forest Grove, OR (US); Adrian Mocanu, Langley (CA); Andrew Morning-Smith, Vancouver (CA); Zeljko Zupanc, Vancouver (CA)

(73) Assignee: Intel Corporation, Santa Clara, CA (US)

(*) Notice: Subject to any disclaimer, the term of this patent is extended or adjusted under 35 U.S.C. 154(b) by 94 days.

(21) Appl. No.: 16/292,825

(22) Filed: Mar. 5, 2019

(65) Prior Publication Data

US 2019/0196562 A1    Jun. 27, 2019

(51) Int. Cl.
*G06F 1/30* (2006.01)
*G06F 1/26* (2006.01)
*G06F 1/28* (2006.01)
*G11C 5/14* (2006.01)

(52) U.S. Cl.
CPC .............. *G06F 1/305* (2013.01); *G06F 1/266* (2013.01); *G06F 1/28* (2013.01); *G11C 5/147* (2013.01)

(58) Field of Classification Search
CPC ..... G11C 5/145; G11C 5/8141; H01S 3/10046; H03F 2200/345; H03F 2200/348
See application file for complete search history.

(56) References Cited

U.S. PATENT DOCUMENTS

| 9,508,399 B1* | 11/2016 | Bottemiller | G11C 5/141 |
| 2008/0160370 A1* | 7/2008 | Masse | H01M 8/04589 |
| | | | 429/429 |
| 2014/0133241 A1* | 5/2014 | Shim | G11C 16/22 |
| | | | 365/185.18 |
| 2014/0380067 A1* | 12/2014 | Laird | G06F 1/26 |
| | | | 713/300 |
| 2017/0090538 A1* | 3/2017 | Wang | G11C 5/14 |

* cited by examiner

*Primary Examiner* — Jaweed A Abbaszadeh
*Assistant Examiner* — Hyun Soo Kim
(74) *Attorney, Agent, or Firm* — Schwabe, Williamson & Wyatt, P.C.

(57) ABSTRACT

In embodiments, an apparatus includes a burst current monitor, to detect a burst of input current drawn by a SSD from a host above a pre-defined burst threshold, and control logic coupled to the burst current monitor. The control logic, in response to the detection by the burst current monitor of the input current above the burst threshold, causes a capacitor of the SSD to supply an assistance current to the SSD, to reduce the input current drawn by the SSD. In embodiments, the capacitor is a hold-up capacitor disposed in a PLI circuit of the SSD, and the apparatus is integrated within a hold-up control logic sub-circuit of the PLI circuit.

18 Claims, 6 Drawing Sheets

REDUCTION OF SSD BURST CURRENT USING POWER LOSS ENERGY STORE

FIELD

The present invention relates to the technical field of computing, and, in particular, to apparatus, computer readable media and methods related to reduction of solid state device (SSD) burst currents using a power loss energy store of the SSD.

BACKGROUND

SSDs are composed of a number of NAND flash devices that may operate concurrently. The NAND flash devices may perform read, program or erase operations as directed by a controller of the SSD. These NAND operations are inherently bursty in their power consumption, and, as a result, power spikes may occur during each operation. The power spikes, or bursts, may last, for example, from microseconds for a read operation, to milliseconds for an erase operation.

SSDs generally draw power from a host computer. When a SSD includes a large number of NAND devices creating semi-random power bursts, bursts from multiple devices may align with each other. The superposition of multiple current spikes occurring at many, or even all of the NAND devices on the SSD may create a overall large burst for the power system. These collective bursts may last, for example, from microseconds to even hundreds of microseconds. While most power systems include input and output capacitors that can absorb bursts lasting for a few microseconds, it is impractical to provide sufficient capacitance to absorb the longer bursts.

While in some cases staggering of memory operations may be implemented to smooth bursts, such as, for example when a large number of erase operations are issued from a host, this is only effective for known sequences of operations where the burst peaks are relatively deterministic. Thus, it is not effective when used for random events that typically occur in a SSD workload. In addition, staggering of operations may also negatively impact performance.

One prior approach has been to pass a long burst onto a host's power system. However, this results in overdesign of the host's power system, as, in this approach, it must be sized to be much larger than the average current drawn by the SSD, sometimes as much as double the average current, in order to support the relatively infrequent occurrences of burst currents. This adds significant additional cost.

DETAILED DESCRIPTION

In embodiments, an apparatus includes a burst current monitor, to detect a burst of input current, drawn by a SSD from a host, above a pre-defined burst threshold, and control logic coupled to the burst current monitor. The control logic, in response to the detection by the burst current monitor of the input current above the burst threshold, causes a current source (e.g., capacitor of the SSD) to supply an assistance current to the SSD, to reduce the input current drawn by the SSD.

In some embodiments, the capacitor is a hold-up capacitor disposed in a PLI circuit of the SSD, and the apparatus is integrated within a hold-up control logic sub-circuit of the PLI circuit.

In embodiments, following the use of an assistance current to supply a portion of the SSD's current draw, the burst current monitor is further to detect that the input current is below a pre-defined capacitor charging threshold, and the control logic, in response to the detection, causes at least some of the input current to be used to charge the capacitor. In this manner the capacitor's stored energy is returned to its original value.

In embodiments, one or more non-transitory computer-readable storage media includes a set of instructions, which, when executed by a device provided in a SSD, cause the device to receive an indication that a burst of input current, drawn by a solid state device (SSD) from a host, is above a pre-defined burst threshold, and in response to the indication, cause a capacitor of the SSD to supply an assistance current to the SSD, to reduce the input current drawn by the SSD.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical integrated circuit (IC) on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

As noted above, SSDs draw power from a host computer's power supply. In designing these power supplies, both an average current and a peak current for an SSD are taken into account, as the power systems must be able to support a worst case scenario of a maximum current drawn by the SSD. Because of concurrent bursty behavior, current bursts of up to double the maximum average current for the SSD can occur. This results in a much higher worst case power specification that a host's power supply must be designed for. In some examples, an SSD with an average power of 2.3 A may experience 4.3 A at peak current draw due to the combined effects of burst currents. In an all-flash array or, for example, 32 SSDs, this effect can compound quite dramatically. Thus, for example, a SDD operating at 12V and an average current of 2.3 A consumes an average power of 12V*2.3 A=27.6 Watts. However, at a peak near doubling of this value, operating at a peak current of 4.3 A, 51.6 W are consumed. For a 32 SSD array, the difference between the required power for average current is thus 883.2 W, or approximately 900 W, whereas the required power to supply the SSD at peak current is 1,651.2 W, a value that is nearly double.

SSDs often are provided with power loss imminent (PLI) circuitry that allows the SSDs to continue to operate for a limited time following a total power loss. The PLI circuits generally include a high voltage capacitor, e.g., a capacitor running at 35V, which stores sufficient electrical energy that may be used to generate a PLI current following loss of power from the host. Storing energy in a high voltage capacitor is more efficient than storing the same amount of energy in a lower voltage capacitor, given that electrical energy is proportional to the square of the voltage, or $E=CV^2$. By increasing the voltage V, the energy output greater by the square of the increased voltage. For example, if the voltage is doubled, the energy stored by the capacitor is quadrupled. In PLI circuitry, the energy stored in the high voltage capacitor is sometimes known as "power loss hold-up energy", as it is used to maintain operation of the SSD for a pre-defined time following a power loss.

In embodiments, a portion of the power loss hold up energy that is built into a SSD is used to inject power to the SSD not just during a power loss, but also during larger power bursts. As a result, in embodiments, while average power is kept roughly constant, worst case bursts that draw increased power from a host are reduced, thereby obviating the need for over-design of a host system's power supply.

Moreover, in embodiments the additional energy needed to offload a burst is small relative to the energy needed to support shutdown, for example, a 10-100 us duration for burst reduction versus a 5-10 ms duration for a shutdown. Thus the required energy to ameliorate a burst condition does not represent a substantial cost increase for SSD. Obviously, it adds no additional cost at all to the host system. In embodiments, for example, existing power circuitry is used with some modifications to control logic, and a small amount of additional hold-up capacitance is added.

Thus, in embodiments, by providing additional current to the SSD during high current burst scenarios, the burst current draw seen by the host is reduced, which allows for either a reduction in power supply capabilities, or the ability of a host to support a greater number of concurrently operating drives.

Besides overdesign of a host's power supply, as noted above, an alternative solution is to add a filter to the SSD built of passive components. This is generally done by increasing the capacitance on the input supply. However, this alternative is much less efficient, because energy must be stored at the lower input voltage, such as, for example, 3.3V or 12V, rather than at the much greater hold-up energy voltage, for example 35V. Because energy is proportional to the square of the voltage, or $V^2$, storage at a lower voltage is far less effective, from 8-100 times less effective for voltages of 3.3V or 12V versus 35V, and more costly. Additionally, implementation of such a large low voltage filter requires significant board area. This may limit form factors or numbers of other components on the SSD. Further, some filter designs may also slow down a host's ability to supply current to the drive due to a smoothing effect, introduced by added inductance. As a result, during a burst, a filtered SSD input voltage droops more, thus adding to the risk of brownouts.

Because SSDs in accordance with various embodiments have a lower burst current, they may have a competitive edge. In embodiments, a host may be used to support arrays of SSDs without having its power delivery over-dimensioned. Moreover, by adjusting the amount of burst protection energy on the drive, in embodiments, backwards compatibility is also provided. For example, SSDs based on future NANDs may be used in current systems according to various embodiments even if the future NAND is more bursty. This is because, in accordance with various embodiments, to the host, the future NAND will appear less bursty than it actually is, like an older NAND SSD. This may be implemented by adjusting parameters of an example burst filtering circuit according to various embodiments, for example by tuning the thresholds for when the burst reduction circuit is activated or deactivated. In this way a future NAND may be made compatible with current generation platforms.

Figure 1:
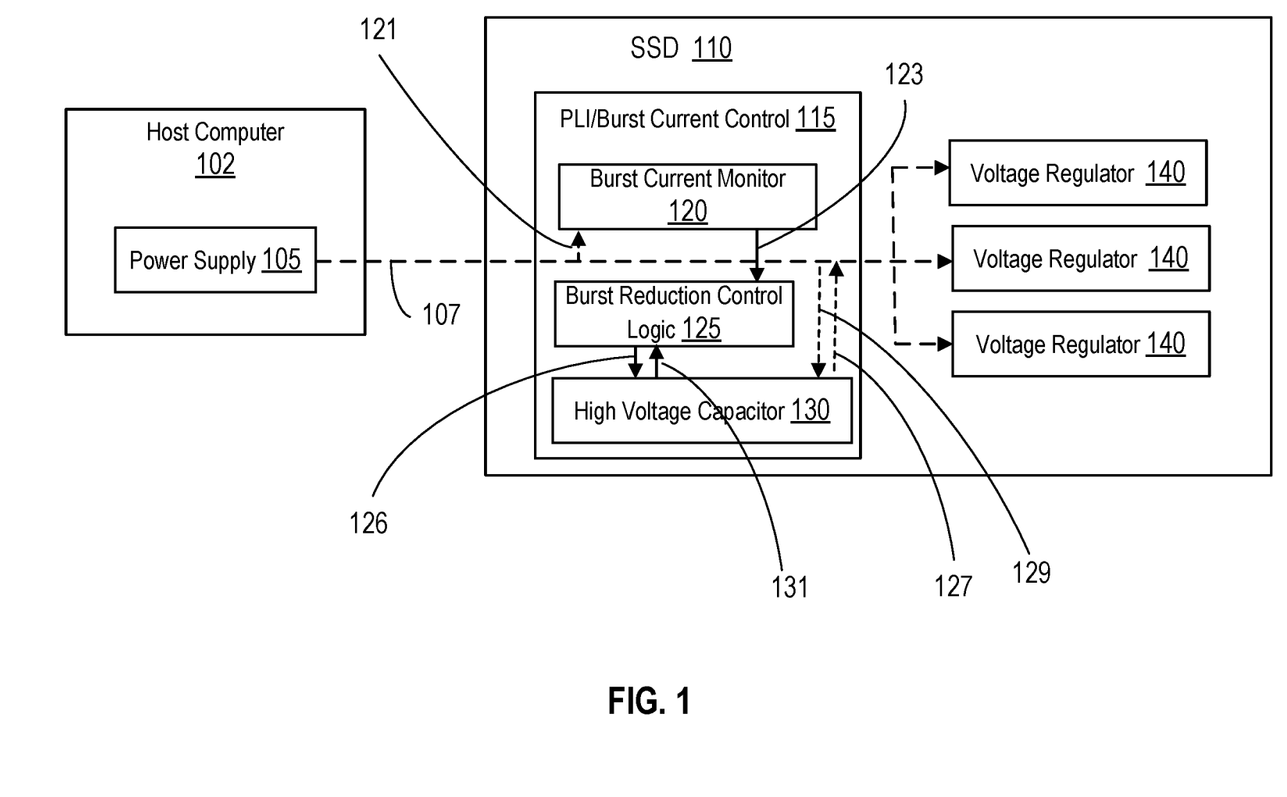
FIG. 1 illustrates an example system in accordance with various embodiments.

FIG. 1 illustrates an example system in accordance with various embodiments. With reference to FIG. 1, there is a host computer 102, which includes power supply 105. Host computer 102 may be a system on chip (SOC), and may include one or more processors, caches, and other components (not shown). There is also shown SSD 110, which may include several individual memory dies (not shown), each coupled to one or more of voltage regulators 140. SSD 110 may be installed in a motherboard of host computer 102. In embodiments, power supply 105 of host computer 102 provides electrical energy in the form of a current to SSD 110, illustrated in FIG. 1 by input current connection 107. As shown, current connection 107, which, in embodiments, may be a wire, set of wires, or other conducting devices, supplies power (an amount of current during a unit time interval) to voltage regulators 140, which, in turn, supply power to individual memory units of SSD 110.

Continuing with reference to FIG. 1, as shown, input current connection 107 also passes through PLI/burst current control circuitry 115. This circuitry includes a burst current monitor 120, which, via connection 121, monitors the current supplied by power supply 105 of host computer 102. It is noted that in FIG. 1 the flow of current is shown in dashed lines 107, 121, 127 and 129, whereas control signals 123, 126 and 131, which control generation of an assistance current in response to the detected burst current, as well as its cessation and subsequent recharging of the capacitor that supplies it, all as described below, are shown as solid lines. Burst current monitor 120 checks for a current in input current connection 107 that exceeds a pre-defined burst threshold. Thus, when the current exceeds that pre-defined threshold, burst current monitor determines that a burst current is being drawn from power supply 105 by SSD 110. In some embodiments, for a SSD operating at 12V, and having an average current draw of 2.3 V, the pre-defined burst current threshold may be set at 2.5V, for example.

Continuing with reference to FIG. 1, once the burst current is detected by burst current monitor 120, burst current monitor 120 sends a first control signal 123 to burst current reduction logic 125, which responds to the burst current condition. Upon receipt of first control signal 123, burst reduction control logic 125 sends a second control signal 126, to high voltage capacitor 130 to cause high voltage capacitor 130 to supply an assistance current 127 to the SSD, to reduce the input current 107 drawn by the SSD from power supply 105 of host computer 102. High voltage capacitor 130 may include several capacitors, which are collectively referred to herein as "high voltage capacitor 130." In embodiments, assistance current 127 is generated when high voltage capacitor 130 releases some of its stored charge. Assistance current 127 then partially supplies the current drawn by voltage regulators 140 of SSD 110. In embodiments, assistance current 127 may be any value between 0 A and the average current drawn by SSD 110 (in the above example this was 2.3 A), as may be necessary to keep the current drawn by SSD 110 from power supply 105 below a pre-defined maximum value. In some embodiments, for example, the value of the assistance current may be fixed, and last for a pre-defined time duration. In other embodiments, for example, the value of assistance current 127 may be a pre-defined fraction of the burst current detected by burst current monitor 120, and may last until burst reduction control logic 125 signals high voltage capacitor 130 to stop the assistance current, as described below with reference to process 400 of FIG. 4. More generally, in some embodiments, a current source can be any device (other than the capacitor 130) that can be configured to provide the assistance current, and associated (e.g., built in or coupled with) the SSD 110.

In either approach to the duration of the assistance current, once assistance current 127 has been terminated, high voltage capacitor needs to be replenished with additional charge to replace the charge it released form storage as assistance current 127. Thus, as shown in FIG. 1, when directed by burst reduction control logic 125, some or all of input current 107 is diverted, as replenishing current 129, to high voltage capacitor 130 until it is charged once again to its full charge. In embodiments, the charge on high voltage capacitor 130 is conveyed to burst reduction control logic 125 via connection 131, to allow burst reduction control logic 125 to control the charge replenishment of high voltage capacitor 130. In embodiments, replenishing current 129 is generated when SSD 110 is idle, or not busy, so as not to divert input current needed to support memory operations.

Figure 2:
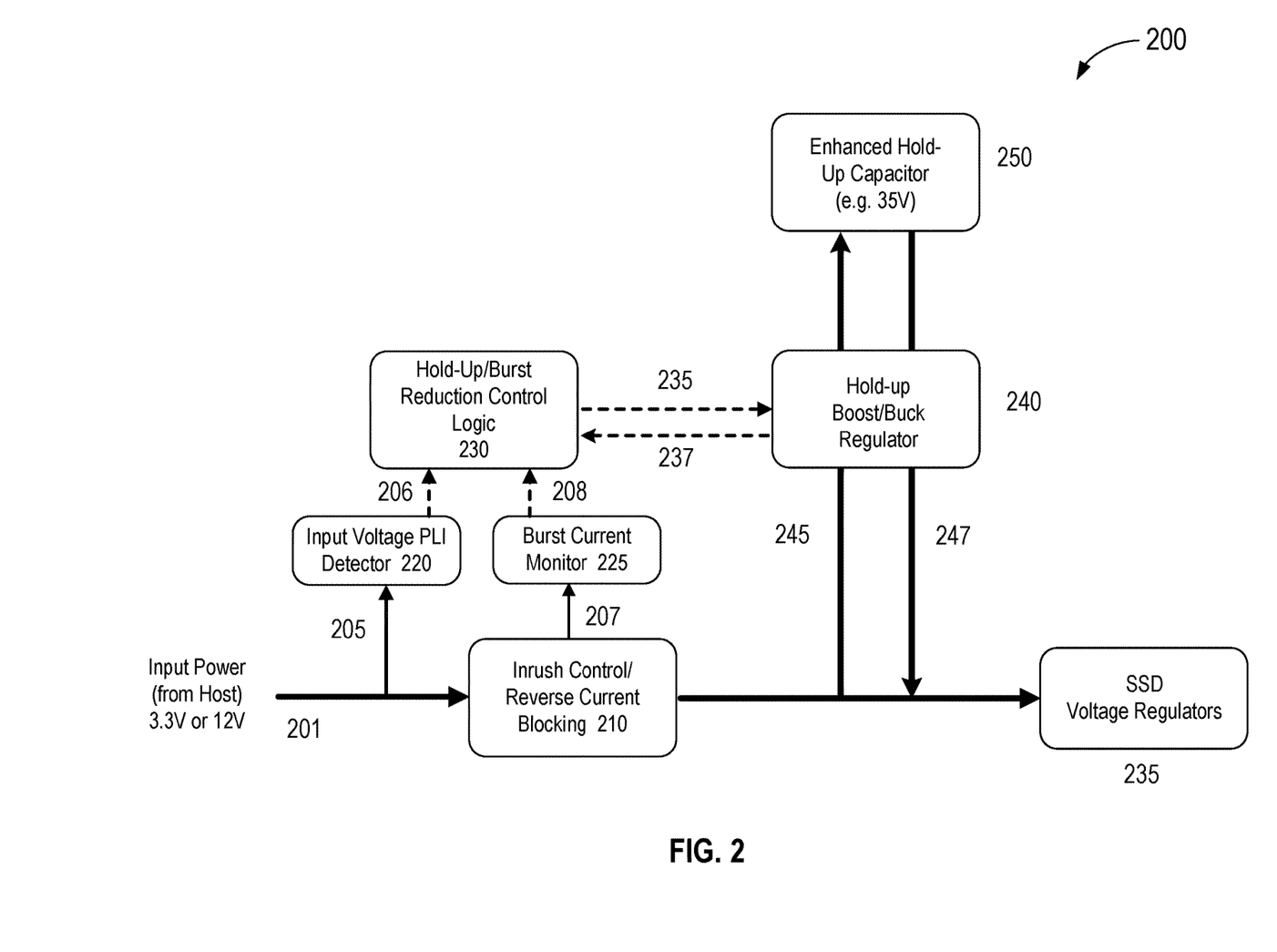
FIG. 2 illustrates an example burst current detection and reduction system, in accordance with various embodiments.

FIG. 2 illustrates an example burst current detection and reduction system, in accordance with various embodiments. In particular, FIG. 2 illustrates an example SSD power loss handling and isolation circuit 200 (also known as a PLI circuit), to which additional features have been added to support burst current detection and reduction, in accordance with various embodiments. The burst current detection and reduction aspects of FIG. 2 present a more detailed version of PLI/burst current control circuitry 115 shown in FIG. 1.

With reference to FIG. 2, input power from a host computer enters system 200 as input current 201. In this example, the SSD may operate at 3.3V or 12V, as shown. There is also shown input voltage PLI detection 220, which is a voltage monitor that detects a significant drop in the normal voltage of the input power, to determine that there has been a loss of power from the host computer. In the event of a loss of power, input voltage PLI detector 220 sends a loss of power signal 206 to hold-up/burst reduction control logic 230. In response to loss of power signal 206, hold-up/burst reduction control logic 230 sends command 235 to hold-up boost/buck regulator 240 to cause hold-up boost/buck regulator 240 to cause a power loss current to be generated by releasing charge from enhanced hold-up capacitor 250 and to flow, along current conduit 247, to supply SSD voltage regulators 235 for a pre-defined time, such as, for example, as may be needed to finish memory accesses that have been queued but not yet executed.

Enhanced hold-up capacitor 250 stores energy at a higher voltage than the operating voltage of the SSD, due to the electrical energy storage efficiencies described above, and delivers this energy to the SSD upon power loss detection. This capacitance is here described as "enhanced" to indicate that, in embodiments, additional capacitance, over and above that needed to support a power loss hold-up, is added to the circuit to also support burst current reduction. Thus, in embodiments, enhanced hold-up capacitor 250 does "double duty", servicing both power loss events as well as current burst events. Accordingly, if a power loss were to occur immediately following a drawdown of energy from enhanced hold-up capacitor 250 in response to a burst current reduction, before any recharging of enhanced hold-up capacitor 250, there would still be a full charge in enhanced hold-up capacitor 250 as needed to support the power loss hold-up functionality. In other embodiments there may be a separate capacitance for power loss and for burst current reduction. In such alternate embodiments, only the burst current reduction capacitance need be recharged following the generation of an assistance current.

Continuing with reference to FIG. 2, from the host, input current 210 flows through inrush control and reverse current blocking field effect transistors (FETs) 210, which is a standard element of PLI circuitry used to control current detection and flow. This element both prevents an inrush of current to the SSD (such as, for example, following power up), and also prevents current from flowing in a backwards direction, out of the SSD and back into the host computer. It is here, via current input 207, that input current 201 may be sampled by connected burst current monitor 225. In embodiments, burst current monitor 225 detects if current drawn by the SSD in an averaging window is too high, and if it is, then burst current monitor 225 sends a signal 208 to a hold-up sub-circuit consisting of hold-up boost/buck regulator 240 and enhanced hold-up capacitor 250. In response to signal 208, hold-up/burst reduction control logic 230 sends command 235 to hold-up boost/buck regulator 240 to cause hold-up boost/buck regulator 240 to cause an assistance current to be generated by releasing charge from enhanced hold-up capacitor 250 and to flow, along current conduit 247, to supply SSD voltage regulators 235 for either a pre-defined time, or, for example, until hold-up boost/buck regulator 240 receives a stop assistance current command from hold-up/burst reduction control logic 230.

Continuing with reference to FIG. 2, after enhanced hold-up capacitor 250 has supplied either an assistance current or a hold-up loss current, both as described above, it needs to be recharged. Thus, as shown in FIG. 2, when directed by hold-up/burst reduction control logic 230, some or all of input current 201 is diverted, as replenishing current 245, by hold-up boost/buck regulator 240 to enhanced high voltage capacitor 250 until it is charged once again to its full charge. In embodiments, the charge on high voltage capacitor 250 is monitored by boost/buck regulator 240 and conveyed to hold-up/burst reduction control logic 230 via signal path 237, to allow hold-up/burst reduction control logic 230 to control the charge replenishment of enhanced high voltage capacitor 250. In embodiments, replenishing current 245 is generated when the SSD is idle, or not busy, so as not to divert input current needed to support memory operations. Hold-up boost/buck regulator 240 converts SSD operating voltage, such as 3.3V or 12V, and "boosts" it up to the higher voltage of enhanced hold-up capacitor 250, e.g., 35V, for a replenishment of charge on enhanced hold-up capacitor 250. In parallel fashion, when an assistance current, or a hold-up power loss current, 247 is generated, Hold-up boost/buck regulator 240 converts the higher voltage of enhanced hold-up capacitor 250, e.g., 35V, to SSD operating voltage, such as 3.3V or 12V. This type of conversion is known as "bucking" the voltage downwards. In embodiments, in this fashion, hold-up boost/buck regulator 240, under the control of hold-up/burst reduction control logic 230, mediates electrical energy transfer from and to enhanced hold-up capacitor 250.

Thus, in embodiments, standard PLI hold-up control logic may be modified (to then be, as modified, "hold-up/burst reduction control logic 230" to draw current from the hold-up capacitance both for PLI and for burst reduction functionalities. It also ensures that the hold-up capacitance (now "enhanced hold-up capacitor") is recharged after a burst has occurred. These modifications may be implemented with minimal additional costs.

Figure 3:
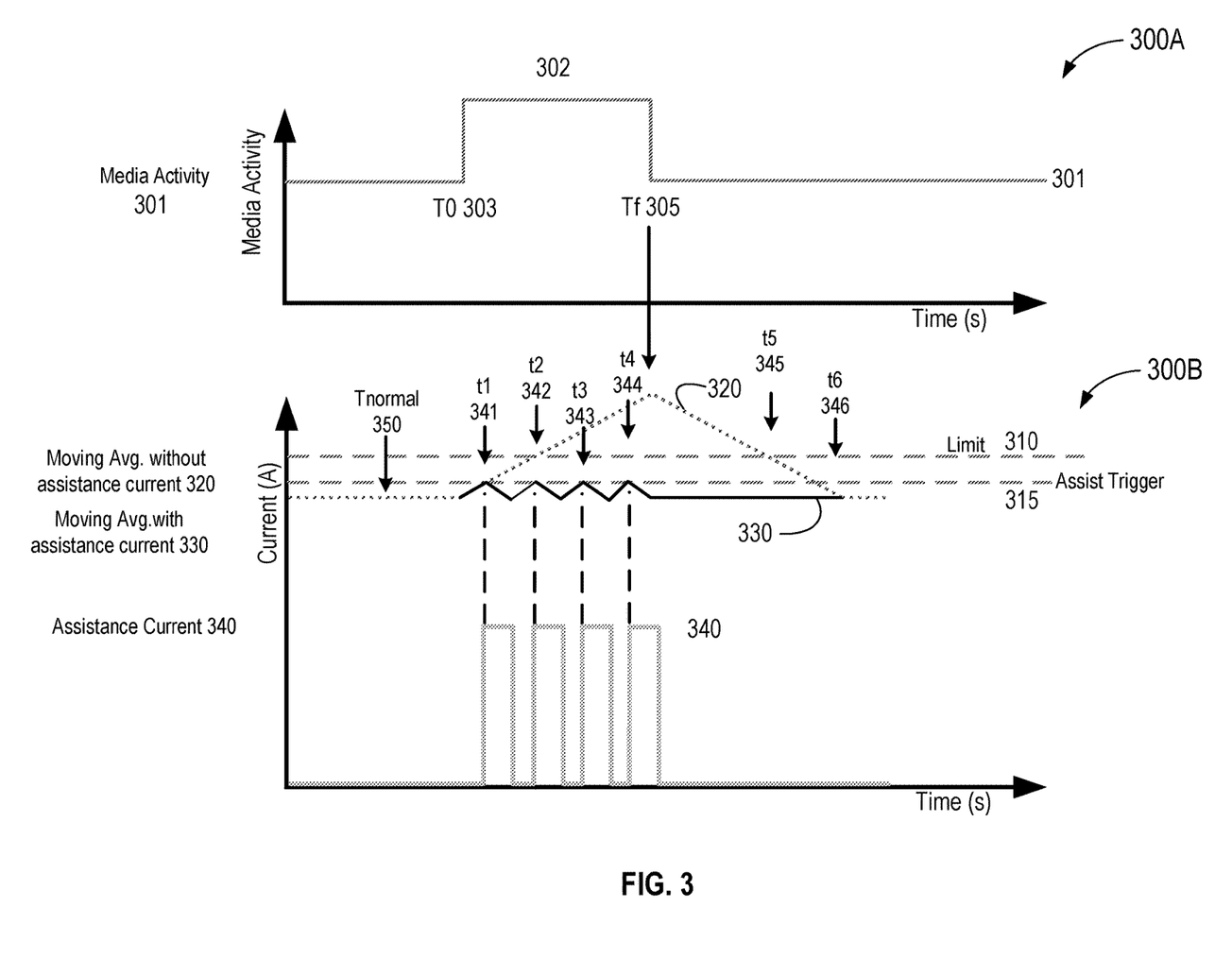
FIG. 3 depicts two plots that collectively illustrate the effect of burst current reduction, in accordance with various embodiments.

FIG. 3 depicts two plots, 300A and 300B, that together illustrate the effect of burst current reduction, in accordance with various embodiments. Plots 300A and 300B have the same time axis. With reference to FIG. 3, an upper plot 300A depicts media activity 301 of an example SSD as a function of time. With reference to plot 300A, there is shown a surge of activity for the duration of interval 302, and this surge in memory activity leads to an increase in the current drawn by the SSD from a host computer, as shown by dotted line 320 in plot 300B, which depicts a moving average of current drawn by the example SSD as a function of time, without any burst current reduction, e.g., by use of an assistance current generated by discharging a capacitance of the SSD, in accordance with various embodiments.

As shown, moving average 320 beings to rise at time T0 303 (shown in plot 300A), just as surge interval 302 begins, continues to rise until time Tf 305 (shown in plot 300A) at the end of surge interval 302, and then drops back to its original value at time t6 346 (shown in plot 300B). At its zenith, at time t=Tf 305, moving average 320 reaches the maximum burst current for the example SSD. This maximum value may be, for example using the exemplary numbers described above, 4.5 A, where moving average 320's "normal" value, prior to the burst due to media activity surge 302, for example at Tnormal 350, as well as after the burst, for example at t=t6 346, is 2.3 A. As is seen in plot 300B, near its zenith, from both sides of the zenith, rolling average 320 far exceeds current limit 310 for the SSD, beginning at time t3 343 and continuing through time t5 345. For example, using the example current values described above, limit 310 may be 3.0 A. Thus, a host computer's power supply designed to supply current for the SSD up to limit 310 of 3.0 A could not adequately supply this SSD during any significant burst. If one were to occur that exceeds the system's capabilities, the voltage supply will droop or brownout, and, if the voltage drops low enough, trigger a PLI response in the SSD.

Continuing with reference to FIG. 3, plot 300B also depicts moving average current as a function of time with burst current reduction 330, in accordance with various embodiments. As is readily seen, moving average 330 is identical to moving average 320 from time t=0 through time=t1 341, at which time they both hit assist trigger line 315. At that point, where t=t1 341, the two moving averages diverge, and moving average 330 does not exceed assist trigger line 315. In embodiments, for the same example values described above of a peak current of 4.5A, a limit of 3.0 A, and a normal average current of 2.3 A, assist trigger may be 2.5 A, for example.

As shown in plot 300B, as soon as moving average 330 hits assist trigger line 315, an assistance current 340 is supplied to the SSD, which, as described above, lowers the current that must be drawn from the host computer. In this example, assistance current 340 is supplied for a fixed time duration, at a fixed current value, as shown. However, as noted above, in other examples an assistance current may be provided at a variable magnitude, and may continue until control logic commands it to stop. Due to the effect of assistance current 340, for each time interval in which assistance current 340 is supplied to the SSD, at the beginning of each interval, such as, for example, at times t1 341, t2 342, t3 343 and t4 344, moving average 330 drops from the current level of the assist trigger, and returns to its normal operational value, for example 2.3 A. Thus, moving average 330 illustrates how, in embodiments, providing an assistance current from a capacitance of the SSD, such as a hold-up capacitance of a modified PLI circuit, for example, keeps moving average 330, and thus the maximum current draw of the SSD, below assist trigger 315. As a result, if the host computer's power supply is configured to deliver a maximum current at the level of limit 310, that power supply can reliably supply power to the SSD, even during significant current bursts.

For most current bursts experienced today, if an increase in PLI capacitance of between 5-10% is used, it is expected that there would not be a need to throttle or stagger media activity. In some embodiments, as an additional safeguard against unpredicted bursts, a trigger may be used to detect if an enhanced hold-up capacitor's stored charge has dropped down to near the level required to support PLI. In such alternate embodiments, if this situation is detected, the SSD may temporarily throttle media activity to allow the burst/hold-up control logic to recharge the enhanced hold-up capacitance. For example, this may be implemented via a feedback loop between the boost/buck controller of the high voltage capacitor and a controller ASIC of the SSD, using a dedicated or generic interrupt signal.

Figure 4:
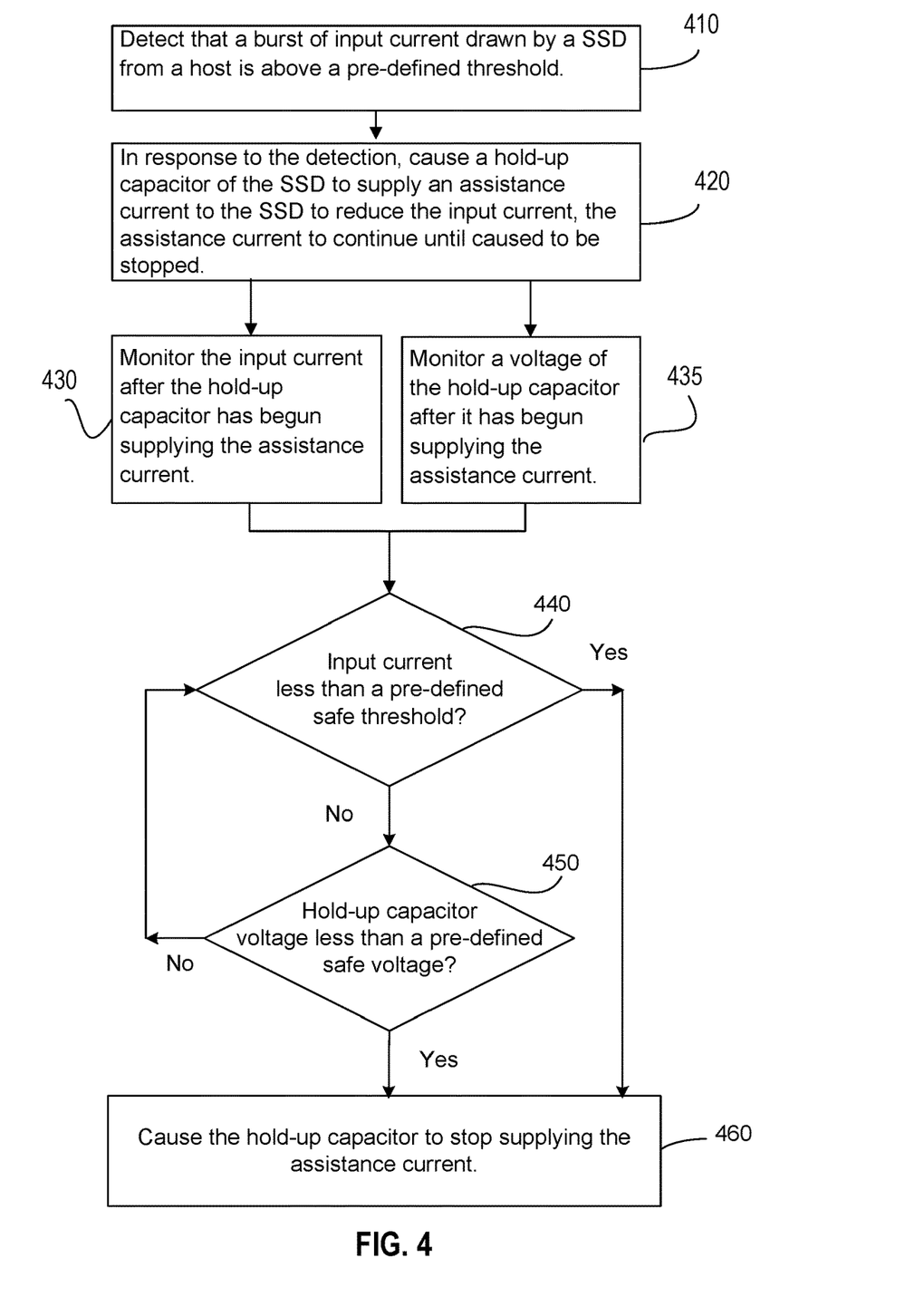
FIG. 4 illustrates an overview of the operational flow of a process for detecting a burst current and causing an assistant current to be supplied to an SSD, in accordance with various embodiments.

Referring now to FIG. 4, an overview of the operational flow of a process 400 for detecting a burst in a SSD's input current and for causing an assistance current to be supplied to the SSD, is depicted in accordance with various embodiments. In embodiments, process 400 may be performed by, for example, PLI/burst control circuitry 115 of FIG. 1, or, for example, circuitry 200 of FIG. 2, described above.

Process 400 may include blocks 410 through 460. In alternate embodiments, process 400 may have more or less operations, and some of the operations may be performed in different order.

With reference to FIG. 4, process 400 begins at block 410, where a burst in input current drawn by a SSD from a host is detected to be in excess of a pre-defined threshold. For example, using the example values described above, and with reference to FIGS. 1 and 2, or burst current monitor 120 of FIG. 1, or burst current monitor 225 of FIG. 2, detects that input current 107 or 201, respectively, exceeds 2.5 A, when the average input current for the SSD is 2.3 A.

From block 410, process 400 proceeds to block 420, where, in response to the detection, a hold-up capacitor of the SSD is caused to supply an assistance current to the SSD to reduce the input current drawn from the host computer, the assistance current to continue until it is caused to be stopped. For example, burst current monitor 120 of FIG. 1 signals burst reduction control logic 125, or burst current monitor 225 of FIG. 2 signals hold-up burst control reduction logic 230, that a burst was detected, and burst reduction control logic 125 signals high voltage capacitor 130, or hold-up burst control reduction logic 230 signals hold-up boost/buck regulator 240 to cause enhanced hold-up capacitor 250, to supply an assistance current to the SSD. In the embodiment of FIG. 4, the assistance current continues to be supplied until, for example, burst reduction control logic 125 signals high voltage capacitor 130, or hold-up burst control reduction logic 230 signals hold-up boost/buck regulator 240 to cause enhanced hold-up capacitor 250, to stop supplying the assistance current.

From block 420, process 400 bifurcates into two paths that, in embodiments, are implemented in parallel. In a first path process 400 moves to block 430, where the input current is monitored following the hold-up capacitor having begun to supply the assistance current. For example, this may be performed by burst current monitor 120 of FIG. 1, or burst current monitor 225 of FIG. 2. In the second path, process 420 moves to block 435, where a voltage of the hold-up capacitor is monitored after it has begun to supply the assistance current. For example, this may be performed by burst reduction control logic 125 of FIG. 1, or hold-up boost/buck regulator 240 of FIG. 2.

From both blocks 430 and 435, process 400 moves to query block 440, where it is determined if the input current is less than a pre-defined safe threshold. For example, this may be performed by burst current monitor 120 of FIG. 1, or burst current monitor 225 of FIG. 2, and, for example, the pre-defined safe threshold may be, for the example SSD described above, 2.1 A, which is slightly lower than the average current of 2.3 A of the SSD. If "Yes" at query block 440, then there is not only no longer a burst current, but, in fact, the SSD's input current is below the average input current by a safety margin. As a result, there is no longer any reason to discharge stored electrical energy from the hold-up capacitor and supply an assistance current, and thus process flow moves to block 460, where the hold-up capacitor is caused to stop supplying the assistance current. For example, burst reduction control logic 125 may signal high voltage capacitor 130, or hold-up burst control reduction logic 230 may signal hold-up boost/buck regulator 240 to cause enhanced hold-up capacitor 250, to stop supplying the assistance current.

On the other hand, if query block 440 returns "No", then the input current draw is still substantial, and it is thus not yet safe to turn off the assistance current. Process 400 moves to query block 450, where it is determined if the voltage of the hold-up capacitor has fallen to less than a pre-defined safe voltage. For example, this determination may be performed by burst reduction control logic 125 of FIG. 1, or hold-up/burst reduction control logic 230 of FIG. 2 upon receipt of a voltage of enhanced hold-up capacitor 250 from hold-up boost/buck regulator 240.

If "Yes" at query block 450, then even though the input current draw may still be substantial, because the voltage of the hold-up capacitor is low enough that the hold-up circuitry may not be able to safely respond to a power loss situation, in which case data may then be lost, the hold-up capacitor must be caused to stop supplying the assistance current. Thus, process 400 moves to block 460, where the hold-up capacitor is caused to stop supplying the assistance current, as described above. In the event that a burst current subsequently occurs while the hold-up capacitor is being charged, the SSD will need to throttle media activity, as no assistance current can be supplied until the hold-up capacitor is recharged.

On the other hand, if query block 450 returns "No", then the hold-up capacitor is at a sufficiently high voltage that it may still supply the assistance current, and process 400 returns to query block 440, where the level of the input current is again tested, as described above.

Figure 5:
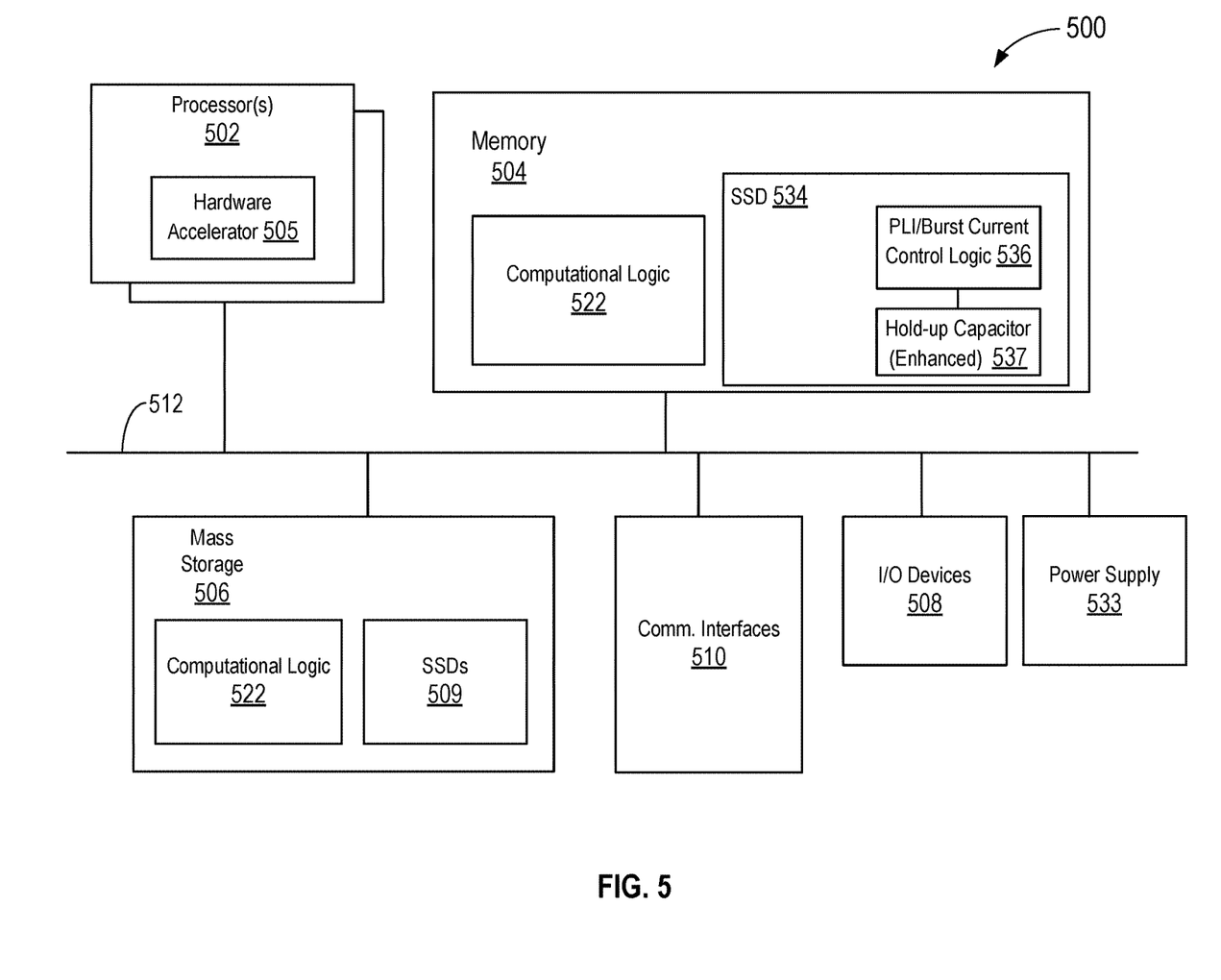
FIG. 5 illustrates a block diagram of a computer device suitable for practicing the present disclosure, in accordance with various embodiments.

Referring now to FIG. 5 wherein a block diagram of a computer device suitable for practicing the present disclosure, in accordance with various embodiments, is illustrated. As shown, computer device 500 may include one or more processors 502, and system memory 504. Each processor 502 may include one or more processor cores, and hardware accelerator 505. An example of hardware accelerator 505 may include, but is not limited to, programmed field programmable gate arrays (FPGAs) (not shown).

Computer device 500 may also include system memory 504. In embodiments, system memory 504 may include any known volatile or non-volatile memory, such as SSD 534. SSD 534 may be supplied with power from a power supply 533 of computer device 500. Additionally, computer device 500 may include mass storage device(s) 506, input/output device interfaces 508 (to interface with various input/output devices, such as, mouse, cursor control, display device (including touch sensitive screen), and so forth) and communication interfaces 510 (such as network interface cards, modems and so forth). In embodiments, communication interfaces 510 may support wired or wireless communication, including near field communication. The elements may be coupled to each other via system bus 512, which may represent one or more buses, including one or more power conduits or buses. In the case of multiple buses, they may be bridged by one or more bus bridges (not shown).

In embodiments, SSD 534 may include PLI/burst current control logic 536, and an enhanced hold-up capacitor 537 that is coupled to PLI/burst current control logic 536, and that may supply an assistance current to SSD 534 in the event of a burst current event, as described above.

In embodiments, system memory 504 and mass storage device(s) 506 may be employed to store a working copy and a permanent copy of the executable code of the programming instructions of an operating system, one or more applications, and/or various software implemented components of PLI/burst current control logic 536, referred to as computational logic 522. The programming instructions implementing computational logic 522 may comprise assembler instructions supported by processor(s) 502 or high-level languages, such as, for example, C, that can be compiled into such instructions. In embodiments, some of computing logic may be implemented in hardware accelerator 505. In embodiments, part of computational logic 522, e.g., a portion of the computational logic 522 associated with the runtime environment of the compiler may be implemented in hardware accelerator 505.

The permanent copy of the executable code of the programming instructions or the bit streams for configuring hardware accelerator 505 may be placed into permanent mass storage device(s) 506 and/or hardware accelerator 505 in the factory, or in the field, through, for example, a distribution medium (not shown), such as a compact disc (CD), or through communication interfaces 510 (from a distribution server (not shown)).

The number, capability and/or capacity of these elements 502-537 may vary, depending on the intended use of example computer device 500, e.g., whether example computer device 500 is a smartphone, tablet, ultrabook, a laptop, a server, a set-top box, a game console, a camera, and so forth. Other aspects of elements 510-534 are otherwise known, and accordingly will not be further described.

Figure 6:
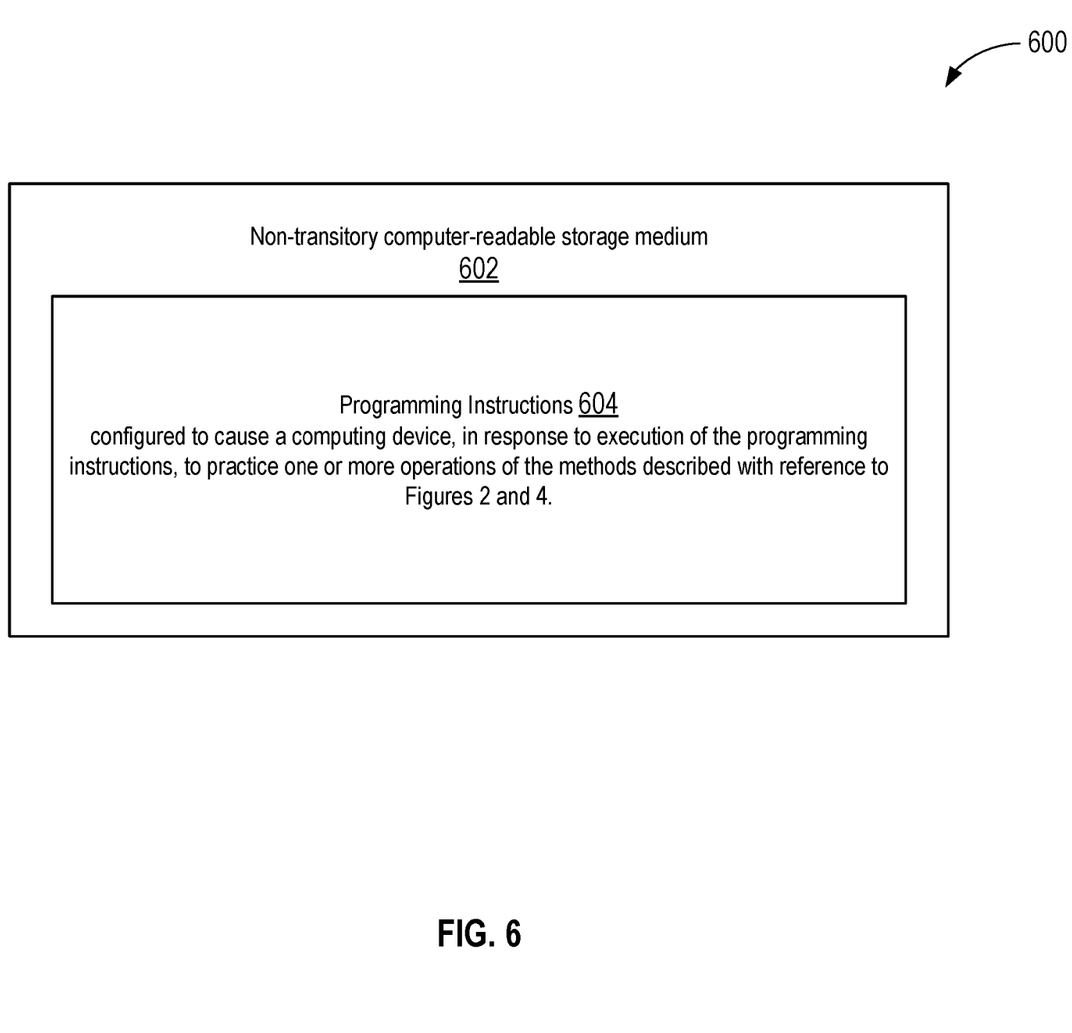
FIG. 6 illustrates an example computer-readable storage medium having instructions configured to practice aspects of the processes of FIGS. 2 and 4, in accordance with various embodiments.

Furthermore, the present disclosure may take the form of a computer program product or data to create the computer program, with the computer program or data embodied in any tangible or non-transitory medium of expression having the computer-usable program code (or data to create the computer program) embodied in the medium. FIG. 6 illustrates an example computer-readable non-transitory storage medium that may be suitable for use to store instructions (or data that creates the instructions) that cause an apparatus, in response to execution of the instructions by the apparatus, to practice selected aspects of the present disclosure. As shown, non-transitory computer-readable storage medium 602 may include a number of programming instructions 604 (or data to create the programming instructions). Programming instructions 604 may be configured to enable a device, e.g., device 500, or components thereof, in response to execution of the programming instructions, to perform, e.g., various programming operations associated with operating system functions, one or more applications, and/or aspects of the present disclosure.

In alternate embodiments, programming instructions 604 (or data to create the instructions) may be disposed on multiple computer-readable non-transitory storage media 602 instead. In alternate embodiments, programming instructions 604 (or data to create the instructions) may be disposed on computer-readable transitory storage media 602, such as, signals. Any combination of one or more computer usable or computer readable medium(s) may be utilized. The computer-usable or computer-readable medium may be, for example but not limited to, one or more electronic, magnetic, optical, electromagnetic, infrared, or semiconductor systems, apparatuses, devices, or propagation media. More specific examples (a non-exhaustive list) of a computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program (or data to create the program) is printed, as the program (or data to create the program) can be electronically captured, via, for instance, optical scanning of the paper or other medium, then compiled, interpreted, or otherwise processed in a suitable manner, if necessary, and then stored in a computer memory (with or without having been staged in or more intermediate storage media). In the context of this document, a computer-usable or computer-readable medium may be any medium that can contain, store, communicate, propagate, or transport the program (or data to create the program) for use by or in connection with the instruction execution system, apparatus, or device. The computer-usable medium may include a propagated data signal with the computer-usable program code (or data to create the program code) embodied therewith, either in baseband or as part of a carrier wave. The computer usable program code (or data to create the program) may be transmitted using any appropriate medium, including but not limited to wireless, wireline, optical fiber cable, RF, etc.

In various embodiments, the program code (or data to create the program code) described herein may be stored in one or more of a compressed format, an encrypted format, a fragmented format, a packaged format, etc. Program code (or data to create the program code) as described herein may require one or more of installation, modification, adaptation, updating, combining, supplementing, configuring, decryption, decompression, unpacking, distribution, reassignment, etc. in order to make them directly readable and/or executable by a computing device and/or other machine. For example, the program code (or data to create the program code) may be stored in multiple parts, which are individually compressed, encrypted, and stored on separate computing devices, wherein the parts when decrypted, decompressed, and combined form a set of executable instructions that implement the program code (the data to create the program code (such as that described herein. In another example, the Program code (or data to create the program code) may be stored in a state in which they may be read by a computer, but require addition of a library (e.g., a dynamic link library), a software development kit (SDK), an application programming interface (API), etc. in order to execute the instructions on a particular computing device or other device. In another example, the Program code (or data to create the program code) may need to be configured (e.g., settings stored, data input, network addresses recorded, etc.) before the program code (or data to create the program code) can be executed/used in whole or in part. Thus, the disclosed Program code (or data to create the program code) are intended to encompass such machine readable instructions and/or program(s) (or data to create such machine readable instruction and/or programs) regardless of the particular format or state of the machine readable instructions and/or program(s) when stored or otherwise at rest or in transit.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

FIG. 6 illustrates an example computer-readable storage medium 600 having instructions configured to implement all (or portion of) software implementations of burst current monitor 120 and burst reduction control logic 125 of FIG. 1, burst current monitor 225 and hold-up/burst reduction control logic 230 of FIG. 2, or PLI/burst reduction control logic 536 of FIG. 5, and/or process 400 of FIG. 4, earlier described, in accordance with various embodiments. As illustrated, computer-readable storage medium 602 may include the executable code of a number of programming instructions or bit streams 604. Executable code of programming instructions (or bit streams) 604 may be configured to enable a device, e.g., computer device 500, in response to execution of the executable code/programming instructions (or operation of an encoded hardware accelerator 505), to perform (aspects of) processes performed by burst current monitor 120 and burst reduction control logic 125 of FIG. 1, burst current monitor 225 and hold-up/burst reduction control logic 230 of FIG. 2, or PLI/burst reduction control logic 536 of FIG. 5, and/or process 400 of FIG. 4. In alternate embodiments, executable code/programming instructions/bit streams 604 may be disposed on multiple non-transitory computer-readable storage medium 602 instead. In embodiments, computer-readable storage medium 602 may be non-transitory. In still other embodiments, executable code/programming instructions 604 may be encoded in transitory computer readable medium, such as signals.

Referring back to FIG. 5, for one embodiment, at least one of processors 502 may be packaged together with a computer-readable storage medium having some or all of computational logic 522 (in lieu of storing in system memory 504 and/or mass storage device 506) configured to practice all or selected ones of the operations earlier described with reference to FIG. 4. For one embodiment, at least one of processors 502 may be packaged together with a computer-readable storage medium having some or all of computational logic 522 to form a System in Package (SiP). For one embodiment, at least one of processors 502 may be integrated on the same die with a computer-readable storage medium having some or all of computational logic 522. For one embodiment, at least one of processors 502 may be packaged together with a computer-readable storage medium having some or all of computational logic 522 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

EXAMPLES

Example 1 is an apparatus, comprising: a burst current monitor, to detect a burst of input current, drawn by a solid state device (SSD) from a host, above a pre-defined burst threshold; and control logic coupled to the burst current monitor, wherein the control logic, in response to the detection by the burst current monitor of the input current above the burst threshold, is to cause a current source associated with the apparatus to supply an assistance current to the SSD, to reduce the input current drawn by the SSD.

Example 2 is the apparatus of example 1, and/or other example herein, wherein: the burst current monitor is further to detect that the input current is below a pre-defined capacitor charging threshold; and the control logic, in response to the detection by the burst current monitor of the input current is below a pre-defined capacitor charging threshold, is further to cause at least some of the input current to be used to charge the capacitor.

Example 3 is the apparatus of example 1, and/or other example herein, wherein the current source is a hold-up capacitor disposed in a power loss imminent (PLI) circuit of the SSD, and wherein the apparatus is integrated within a hold-up control logic sub-circuit of the PLI circuit.

Example 4 is the apparatus of example 3, and/or other example herein, wherein the control logic causes the capacitor of the SSD to supply an assistance current to the SSD by causing a boost/buck voltage regulator coupled to the capacitor to convert a voltage of the hold-up capacitor to a voltage of the SSD to supply the assistance current.

Example 5 is the apparatus of example 1, and/or other example herein, wherein the pre-defined burst threshold is a specified average current of the SSD multiplied by a burst factor N.

Example 6 is the apparatus of example 5, and/or other example herein, wherein N is between 1.0 and 1.4.

Example 7 is the apparatus of example 1, and/or other example herein, wherein the assistance current is a specified average current of the SSD multiplied by an assistance factor M, wherein M is between 0 and 1.

Example 8 is the apparatus of example 3, and/or other example herein, wherein the control logic causes the capacitor of the SSD to supply the assistance current to the SSD for a pre-defined time.

Example 9 is the apparatus of example 1, and/or other example herein, wherein the control logic causes the capacitor of the SSD to supply the assistance current to the SSD until instructed to stop, and wherein: the burst current monitor is further to monitor the input current after the capacitor has begun and detect that the input current is less than a pre-defined safe threshold; the control logic is further to, in response to the detection, cause the capacitor to stop supplying the assistance current.

Example 10 is the apparatus of example 9, and/or other example herein, wherein the pre-defined safe threshold is an input current less than or equal to a specified average current of the SSD multiplied by a safe current factor L, wherein the safe current factor L is between 0.7 and 1.

Example 11 is the apparatus of example 9, and/or other example herein, wherein the control logic is further to receive a capacitor voltage, determine if the capacitor voltage is less than a pre-determined minimum capacitor voltage, and, in response to the determination, cause the capacitor to stop supplying the assistance current.

Example 12 is the apparatus of example 1, and/or other example herein, wherein the apparatus comprises the SSD.

Example 13 is one or more non-transitory computer-readable storage media comprising a set of instructions, which, when executed by a device provided in a SSD, cause the device to: receive an indication that a burst of input current, drawn by a solid state device (SSD) from a host, is above a pre-defined burst threshold; and in response to the indication, cause a capacitor of the SSD to supply an assistance current to the SSD, to reduce the input current drawn by the SSD.

Example 14 is the one or more non-transitory computer-readable storage media of example 13, and/or other example herein, wherein: the pre-defined burst threshold is a specified average current of the SSD multiplied by a burst factor N, where N is between 1.0 and 1.4; and the assistance current is a specified average current of the SSD multiplied by an assistance factor M, wherein M is between 0 and 1.

Example 15 is the one or more non-transitory computer-readable storage media of example 13, and/or other example herein, further comprising instructions that, when executed, cause the device to: receive an indication that the input current is below a pre-defined capacitor charging threshold; and in response to the indication, cause at least some of the input current to be provided to the hold-up capacitor to re-charge it.

Example 16 is the one or more non-transitory computer-readable storage media of example 13, and/or other example herein, further comprising instructions that, when executed, cause the device to cause the assistance current to be supplied by the capacitor at a pre-defined level, for one of: a pre-defined time, or until the device causes the capacitor to stop supplying the assistance current.

Example 17 is the one or more non-transitory computer-readable storage media of example 16, and/or other example herein, further comprising instructions that, when executed, cause the device to: receive a hold-up capacitor voltage; determine if the hold-up capacitor voltage is less than a pre-defined minimum safe hold-up capacitor voltage; and in response to the determination, cause the capacitor to stop supplying the assistance current.

Example 18 is a method, comprising: detecting that a burst of input current, drawn by a solid state device (SSD) from a host, is above a pre-defined threshold; and in response to the detection of the input current above the burst threshold, causing a capacitor of the SSD to supply an assistance current to the SSD, to reduce the input current drawn by the SSD.

Example 19 is the method of example 18, and/or other example herein, wherein the capacitor of the SSD is a hold-up capacitor, and further comprising: causing the hold-up capacitor to continue to supply the assistance current until instructed to stop; monitoring the input current after the hold-up capacitor has begun supplying the assistance current; determining that the input current is less than a pre-defined safe threshold; and in response to the determination, causing the hold-up capacitor to stop supplying the assistance current.

Example 20 is the method of example 18, and/or other example herein, wherein the capacitor of the SSD is a hold-up capacitor, and further comprising: causing the hold-up capacitor to continue to supply the assistance current until stopped; receiving a hold-up capacitor voltage value; determining if the hold-up capacitor voltage value is less than a pre-defined minimum hold-up capacitor voltage; and in response, causing the hold-up capacitor to stop supplying the assistance current.

Example 21 is an apparatus, comprising: means for receiving an indication that a burst of input current, drawn by a solid state device (SSD) from a host, is above a pre-defined burst threshold; and means for causing a capacitor of the SSD to supply an assistance current to the SSD, to reduce the input current drawn by the SSD.

Example 22 is the apparatus of example 21, and/or other example herein, wherein: the pre-defined burst threshold is a specified average current of the SSD multiplied by a burst factor N, where N is between 1.0 and 1.4; and the assistance current is a specified average current of the SSD multiplied by an assistance factor M, wherein M is between 0 and 1.

Example 23 is the apparatus of example 21, and/or other example herein, further comprising: means for receiving an indication that the input current is below a pre-defined capacitor charging threshold; and means for causing at least some of the input current to be provided to the hold-up capacitor to re-charge it.

Example 24 is the apparatus of example 21, and/or other example herein, further comprising means for causing the assistance current to be supplied by the capacitor at a pre-defined level, for one of: a pre-defined time, or until caused to stop supplying the assistance current.

Example 25 is the apparatus of example 24, and/or other example herein, further comprising: means for receiving a hold-up capacitor voltage; means for determining if the hold-up capacitor voltage is less than a pre-defined minimum safe hold-up capacitor voltage; and means for causing the capacitor to stop supplying the assistance current.

What is claimed is:

1. An apparatus, comprising:
  a burst current monitor included in a burst current control circuitry, to detect a burst of input current, drawn by a solid state device (SSD) from a host, above a pre-defined burst threshold, wherein the pre-defined burst threshold is a specified average current of the SSD multiplied by a burst factor N; and
  control logic included in the burst current control circuitry and coupled to the burst current monitor, wherein the control logic, in response to the detection by the burst current monitor of the input current above the burst threshold, is to cause a current source associated with the apparatus to supply an assistance current to the SSD, to reduce the input current drawn by the SSD.

2. The apparatus of claim 1, wherein:
  the burst current monitor is further to detect that the input current is below a pre-defined charging threshold; and
  the control logic, in response to the detection by the burst current monitor of the input current is below a pre-defined charging threshold, is further to cause at least some of the input current to be used to charge the current source.

3. The apparatus of claim 1, wherein the current source is a hold-up capacitor disposed in a power loss imminent (PLI) circuit of the SSD, and wherein the apparatus is integrated within a hold-up control logic sub-circuit of the PLI circuit.

4. The apparatus of claim 3, wherein the control logic causes the capacitor of the SSD to supply the assistance current to the SSD by causing a boost/buck voltage regulator coupled to the capacitor to convert a voltage of the hold-up capacitor to a voltage of the SSD to supply the assistance current.

5. The apparatus of claim 1, wherein N is between 1.0 and 1.4.

6. The apparatus of claim 1, wherein the assistance current is a specified average current of the SSD multiplied by an assistance factor M, wherein M is between 0 and 1.

7. The apparatus of claim 3, wherein the control logic causes the capacitor of the SSD to supply the assistance current to the SSD for a pre-defined time.

8. The apparatus of claim 3, wherein the control logic causes the capacitor of the SSD to supply the assistance current to the SSD until instructed to stop, and wherein:
the burst current monitor is further to monitor the input current after the capacitor has begun and detect that the input current is less than a pre-defined safe threshold;
the control logic is further to, in response to the detection, cause the capacitor to stop supplying the assistance current.

9. The apparatus of claim 8, wherein the pre-defined safe threshold is an input current less than or equal to a specified average current of the SSD multiplied by a safe current factor L, wherein the safe current factor L is between 0.7 and 1.

10. The apparatus of claim 8, wherein the control logic is further to receive a capacitor voltage, determine if the capacitor voltage is less than a pre-determined minimum capacitor voltage, and, in response to the determination, cause the capacitor to stop supplying the assistance current.

11. The apparatus of claim 1, wherein the apparatus comprises the SSD.

12. One or more non-transitory computer-readable storage media comprising a set of instructions, which, when executed by a device provided in a SSD, cause the device to:
receive an indication that a burst of input current, drawn by a solid state device (SSD) from a host, is above a pre-defined burst threshold; and
in response to the indication, cause a capacitor of the SSD to supply an assistance current to the SSD, to reduce the input current drawn by the SSD, wherein:
the pre-defined burst threshold is a specified average current of the SSD multiplied by a burst factor N, where N is between 1.0 and 1.4; and
the assistance current is a specified average current of the SSD multiplied by an assistance factor M, wherein M is between 0 and 1.

13. The one or more non-transitory computer-readable storage media of claim 12, further comprising instructions that, when executed, cause the device to:
receive an indication that the input current is below a pre-defined capacitor charging threshold; and
in response to the indication, cause at least some of the input current to be provided to the capacitor to re-charge it.

14. The one or more non-transitory computer-readable storage media of claim 12, further comprising instructions that, when executed, cause the device to cause the assistance current to be supplied by the capacitor at a pre-defined level, for one of:
a pre-defined time, or
until the device causes the capacitor to stop supplying the assistance current.

15. The one or more non-transitory computer-readable storage media of claim 14, further comprising instructions that, when executed, cause the device to:
receive a hold-up capacitor voltage;
determine if the hold-up capacitor voltage is less than a pre-defined minimum safe hold-up capacitor voltage; and
in response to the determination, cause the capacitor to stop supplying the assistance current.

16. A method, comprising:
detecting that a burst of input current, drawn by a solid state device (SSD) from a host, is above a pre-defined threshold; and
in response to the detection of the input current above the burst threshold, causing a capacitor of the SSD to supply an assistance current to the SSD, to reduce the input current drawn by the SSD, wherein:
the pre-defined burst threshold is a specified average current of the SSD multiplied by a burst factor N, where N is between 1.0 and 1.4; and
the assistance current is a specified average current of the SSD multiplied by an assistance factor M, wherein M is between 0 and 1.

17. The method of claim 16, wherein the capacitor of the SSD is a hold-up capacitor, and further comprising:
causing the hold-up capacitor to continue to supply the assistance current until instructed to stop;
monitoring the input current after the hold-up capacitor has begun supplying the assistance current;
determining that the input current is less than a pre-defined safe threshold; and
in response to the determination, causing the hold-up capacitor to stop supplying the assistance current.

18. The method of claim 16, wherein the capacitor of the SSD is a hold-up capacitor, and further comprising:
causing the hold-up capacitor to continue to supply the assistance current until stopped;
receiving a hold-up capacitor voltage value;
determining if the hold-up capacitor voltage value is less than a pre-defined minimum hold-up capacitor voltage; and
in response, causing the hold-up capacitor to stop supplying the assistance current.

* * * * *